(12) United States Patent
Reykowski

(10) Patent No.: US 7,551,147 B2
(45) Date of Patent: Jun. 23, 2009

(54) ANTENNA ASSEMBLY FOR MAGNETIC RESONANCE UNIT

(75) Inventor: Arne Reykowski, Gainesville, FL (US)

(73) Assignee: Siemens Aktiengesellschaft, Munich (DE)

( * ) Notice: Subject to any disclaimer, the term of this patent is extended or adjusted under 35 U.S.C. 154(b) by 126 days.

(21) Appl. No.: 11/884,978

(22) PCT Filed: Feb. 21, 2006

(86) PCT No.: PCT/EP2006/060124

§ 371 (c)(1), (2), (4) Date: Aug. 22, 2007

(87) PCT Pub. No.: WO2006/089884

PCT Pub. Date: Aug. 31, 2006

(65) Prior Publication Data

US 2008/0143624 A1    Jun. 19, 2008

(30) Foreign Application Priority Data

Feb. 22, 2005  (DE)  ........................ 10 2005 008 048

(51) Int. Cl.
*H01Q 9/30* (2006.01)
*G01R 33/34* (2006.01)
(52) U.S. Cl. ...................... 343/900; 324/318
(58) Field of Classification Search ................ 343/787, 343/900; 324/318
See application file for complete search history.

(56) References Cited

U.S. PATENT DOCUMENTS 6,369,570 B1   4/2002   Wong et al.
6,795,037 B2 * 9/2004   Greim ........................ 343/900
6,806,710 B1 * 10/2004  Renz et al. ................. 324/318
6,842,003 B2 * 1/2005   Heid et al. .................. 324/318
6,943,551 B2 * 9/2005   Eberler et al. ............... 324/318
2004/0100262 A1 5/2004  Seeber

FOREIGN PATENT DOCUMENTS

WO    WO 03/008988    1/2003

OTHER PUBLICATIONS

"A Spiral Volume Coil for Improved RF Field Homogeneity at High Static Magnetic Field Strength," Alsop et al, Magnetic Resonance In Medicine, vol. 40 (1998), pp. 49-54.

* cited by examiner

*Primary Examiner*—Shih-Chao Chen
(74) *Attorney, Agent, or Firm*—Schiff Hardin LLP

(57) ABSTRACT

An antenna for a magnetic resonance unit has a number of antenna rods arranged substantially regularly around an antenna axis, and being axially oriented relative to said antenna axis. Each antenna rod has two opposite ends with a central portion therebetween. The ends of each rod are electrically connected with the ends of at least one adjacent antenna rod by connecting elements oriented tangentially relative to the antenna axis. The rods are symmetrical relative to a plane of symmetry that proceeds perpendicularly relative to the antenna axis. Each point of each antenna rod defines a radial direction with the antenna axis, and the central portion defines a reference direction with respect to the antenna axis. Each radial direction forms a tangential angle with the reference direction, which is a non-constant function of the axial spacing of each point from the central portion of that rod.

8 Claims, 3 Drawing Sheets

ANTENNA ASSEMBLY FOR MAGNETIC RESONANCE UNIT

BACKGROUND OF THE INVENTION

1. Field of the Invention

The present invention concerns an antenna arrangement for a magnetic resonance system, of the type having a number of antenna rods that are essentially arranged regularly around an antenna axis and proceed essentially axially relative to the antenna axis, wherein each antenna rod exhibits two rod ends and a rod center, the rod ends of each antenna rod being connected in an electrically-conductive manner with the rod ends of at least one of its immediately neighboring antenna rods via connection elements proceeding essentially tangentially relative to the antenna axis.

2. Description of the Prior Art

Antenna arrangements of the above-described type are generally known and are shown in FIG. 1 and FIG. 2.

FIG. 1 shows what is known as a birdcage resonator. The birdcage resonator comprises a number of antenna rods 1. The antenna rods 1 are regularly arranged around an antenna axis 2. They are even for the most part uniformly arranged around the antenna axis 2. They run essentially parallel to the antenna axis 2, advantageously even exactly parallel to the antenna axis 2.

The antenna axis 2 represents a preferred direction of a cylindrical coordinate system. The terms "axial", "radial" and "tangential" are used herein as follows: "axial" designates a direction parallel to the antenna axis 2 and "radial" and "tangential" designate directions perpendicular to the antenna axis 2. The direction toward and away from the antenna axis 2 is designated as "radial"; the direction around the antenna axis 2 is designated as "tangential".

According to FIG. 1, each antenna rod 1 exhibits two rod ends 3, 4 and a rod center 5. The rod center 5 is thereby equidistant from the rod ends 3, 4. Corresponding rod ends 3, 4 of the antenna rods 1 are connected with one another in an electrically-conductive manner via two closed ferrules 6, 7 or rings. Each antenna rod 1 is thus connected in an electrically-conductive manner with one of the ferrules 6, 7 per each of its rod ends 3, 4. The ferrules 6, 7 thus represent connection elements 6, 7 for electrically-conductive connection of the rod ends 3, 4, the connection elements 6, 7 proceeding essentially tangential to the antenna axis 2.

The antenna rods 1 are mirror-symmetrical with regard to a plane of symmetry due to the arrangement of the antenna rods 1 parallel to the antenna axis 2. The plane of symmetry is perpendicular to the antenna axis 2 and contains the rod centers 5.

With regard to each antenna rod 1, its rod center 5 defines with the antenna axis 2 a radially proceeding reference direction. Each point of the same antenna rod 1 defines with the antenna axis 2 a radial direction. Due to the circumstance that the antenna rods 1 of the antenna arrangement from FIG. 1 run parallel to the antenna axis 2, all radial directions thus are naturally identical with the reference direction. Each radial direction therefore forms with the reference direction an angle of 0° that remains constantly zero over the entire antenna rod 1.

The representation according to FIG. 2 essentially corresponds to that of FIG. 1. In contrast to the representation from FIG. 1, the connection elements 6, 7 of FIG. 2 are not fashioned as closed ferrules but rather as ferrule segments 6, 7. Precisely two rod ends 3, 4 are respectively connected with one another in an electrically-conductive manner via said ferrule segments 6, 7. As a result, the antenna rods 1 and the connection elements 6, 7 form a number of individual antennas 10 of an antenna array. The remainder the design of the antenna arrangement corresponds to that of FIG. 1.

Magnetic resonance excitation occurs in an examination volume (transmission operation of the antenna arrangement) and magnetic resonance signals can be received from the examination volume (acquisition operation of the antenna arrangement) by means of the generally known antenna arrangements described in the preceding. The examination volume is thereby essentially cylindrical, and the dimensions of the examination volume essentially correspond with the dimensions of the antenna arrangement.

It is also known (for example from WO-A-03/008988) to use an antenna arrangement that represents a modified form of the antenna arrangement of FIG. 1. In this antenna arrangement the antenna rods 1 are directed around the antenna axis 2 like a helix. This antenna arrangement can be imagined most simply as if the ferrules 6, 7 were skewed counter to one another in the antenna arrangement of FIG. 1. In this case the antenna rods 1 are naturally no longer mirror-symmetrical to the plane of symmetry. Rather, in this case each radial direction of a point (insofar as the point is not identical with the rod center 5) forms, with the reference direction, a tangential angle. For each antenna rod 1 the tangential angle is a non-constant function of the axial separation of the respective point from the rod center 5. As a rule the tangential angles increase linearly from the rod center 5 of each antenna rod 1 toward the rod ends 3, 4 of this antenna rod 1 with increasing axial spacing of the points from the rod center 5.

The excitation signals generated by the antenna arrangements of the prior art and the sensitivity of the antenna arrangements of the prior art to magnetic resonance signals is already quite good. Theoretical calculations, however, show that the antenna arrangements of the prior art are not yet optimal.

SUMMARY OF THE INVENTION

An object of the present invention is to provide an antenna arrangement that exhibits operating properties superior relative to the known antenna arrangements.

The above object is achieved in accordance with the present invention by an antenna arrangement for a magnetic resonance system having a number of antenna rods that are arranged essentially regularly around an antenna axis and proceeding substantially axially relative to the antenna axis, with the rod ends of each antenna rod being electrically connected with the rod ends of at least one of the antenna rods that is immediately adjacent thereto by connection elements that proceed substantially tangentially to the antenna axis, and wherein the antenna rods are mirror-symmetrical relative to a symmetry plane that proceeds perpendicular to the antenna axis, and wherein each point of an antenna rod defines, with the antenna axis, a radial direction and the rod center defines, with the antenna axis, a reference direction, and each radial direction forms, with the reference direction, a tangential angle, this tangential angle, with regard to each antenna rod, being a non-constant function of the axial spacing of the respective point from the rod center.

In the inventive antenna arrangement the antenna rods are thus mirror-symmetrical relative to a plane of symmetry perpendicular to the antenna axis, just as in, for example, the standard birdcage resonator. In contrast to the standard birdcage resonator, however, the tangential angle (that forms with the reference direction a point of the antenna rod) is, with regard to each antenna rod, a non-constant function of the axial separation of the respective point from the rod center.

Particularly good results are achieved when the tangential angles increase monotonically from the rod center of each antenna rod towards the rod ends of this antenna rod with the axial separation of the points from the rod center. The tangential angles can alternatively increase linearly, more sharply than linearly, or weaker than linearly, with the axial spacing of the points from the rod center.

Alternatively, the tangential angles can increase monotonically with the axial spacing of the points from the rod end from the rod center of each antenna rod toward the rod ends of this antenna rod in at least one first segment and decrease monotonically with the axial spacing of the points from the rod end in at least one second segment. The first segment thus is arranged closer to the rod end than the second segment.

The connection elements can be fashioned as closed ferrules, so each antenna rod is connected in an electrically-conductive manner with one of the ferrules per each of its rod ends. In this case the antenna arrangement is fashioned as a structure similar to a birdcage.

Alternatively, the connection elements can be fashioned as ferrule segments, with respectively exactly two rod ends being connected with one another in an electrically-conductive manner via the connection elements. In this case the antenna arrangement is fashioned as an antenna array.

DESCRIPTION OF THE PREFERRED EMBODIMENTS

Figure 1:
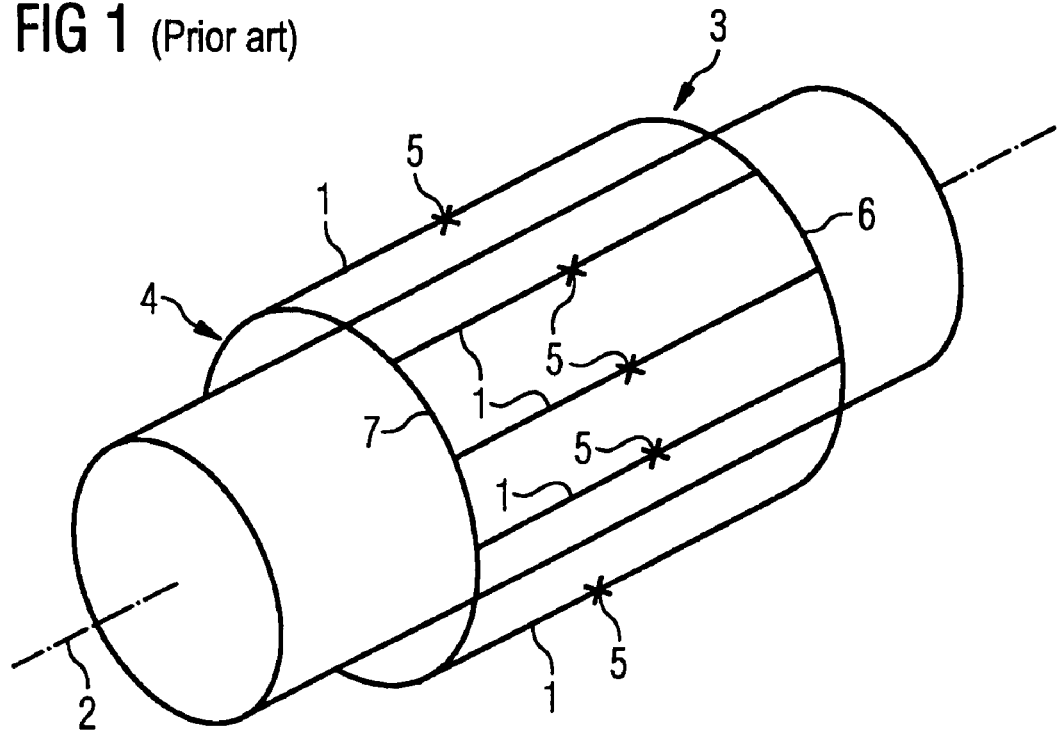
FIG. 1 and FIG. 2 show antenna arrangements of the prior art in perspective representation.

According to FIG. 3 and FIG. 4, the inventive antenna arrangements for a magnetic resonance system are fashioned similar to the antenna arrangements described in connection with FIG. 1 and FIG. 2. They thus likewise have a number of antenna rods 1 that are regularly arranged around an antenna axis 2 and essentially run axially relative to the antenna axis 2. As before, each antenna rod 1 exhibits two rod ends 3, 4 and a rod center 5.

The rod ends 3, 4, of each antenna rod 1 are connected in an electrically-conductive manner with the rod ends 3, 4 of at least one of its immediately neighboring antenna rods 1 via connection elements 6, 7. The connection elements 6, 7 thereby essentially run tangentially relative to the antenna axis 2.

Figure 3:
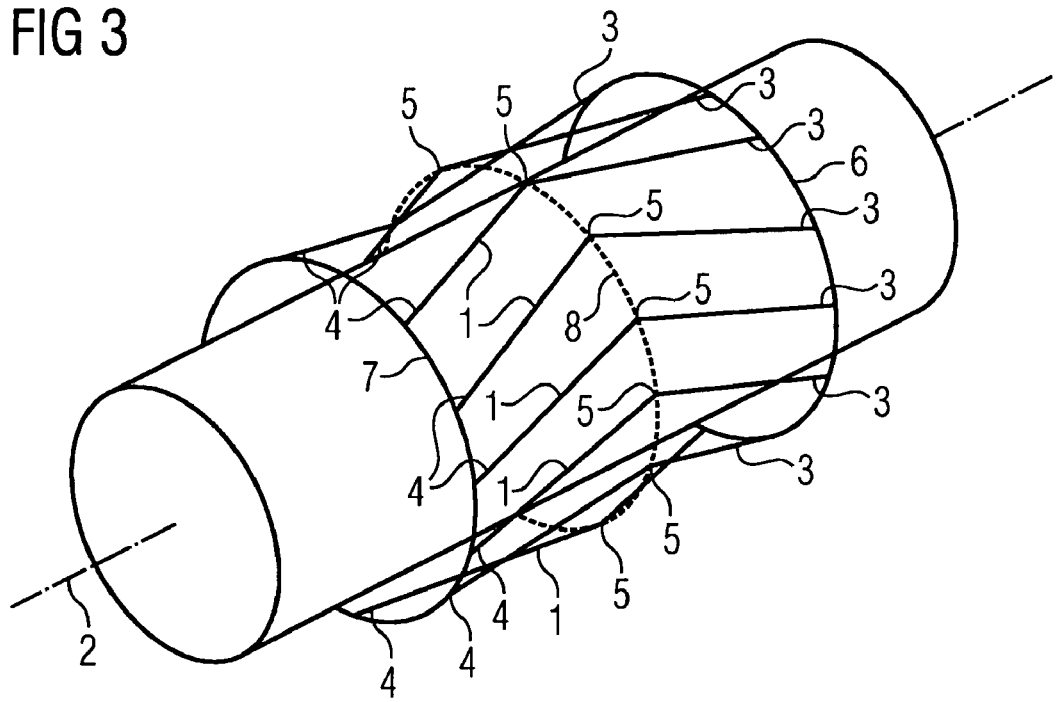
FIG. 3 and FIG. 4 respectively show embodiments of inventive antenna arrangements in perspective views.

In the antenna arrangement according to FIG. 3 the connection elements 6, 7 are fashioned as closed ferrules 6, 7. In this case the antenna arrangement is fashioned like a birdcage so that each antenna rod 1 with each of its rod ends 3, 4 is thus connected in an electrically-conductive manner with one of the ferrules 6, 7. In contrast to this, in the antenna arrangement according to FIG. 4 the antenna arrangement is fashioned as an antenna array. In this case the connection elements 6, 7 are fashioned as ferrule segments via which precisely two rod ends 3, 4 are respectively connected with one another in an electrically-conductive manner.

Figure 2:
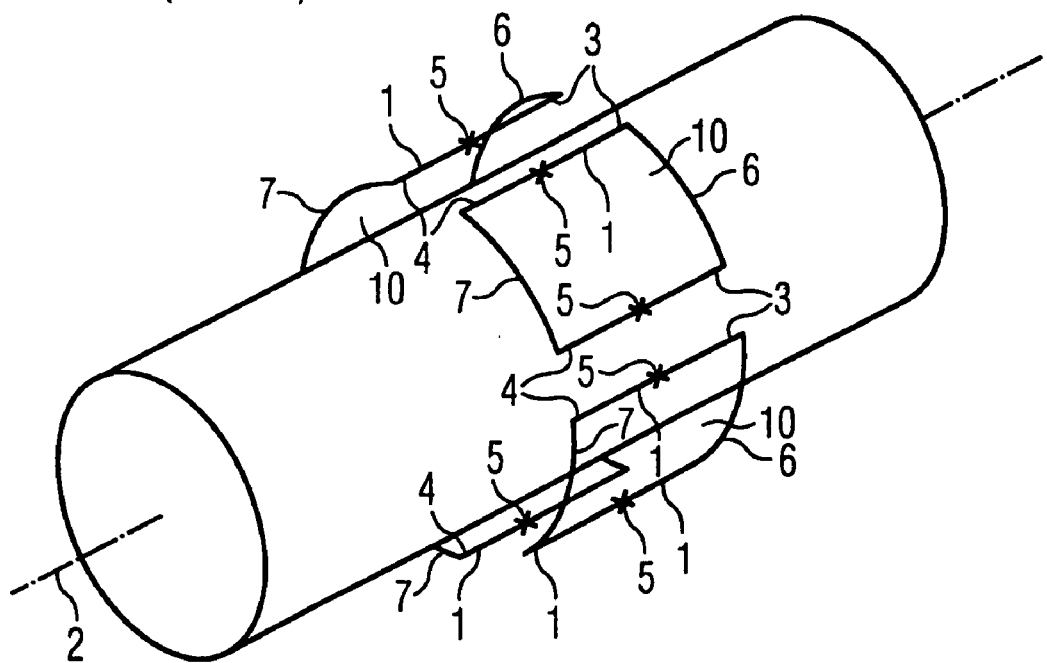
Figure 4:
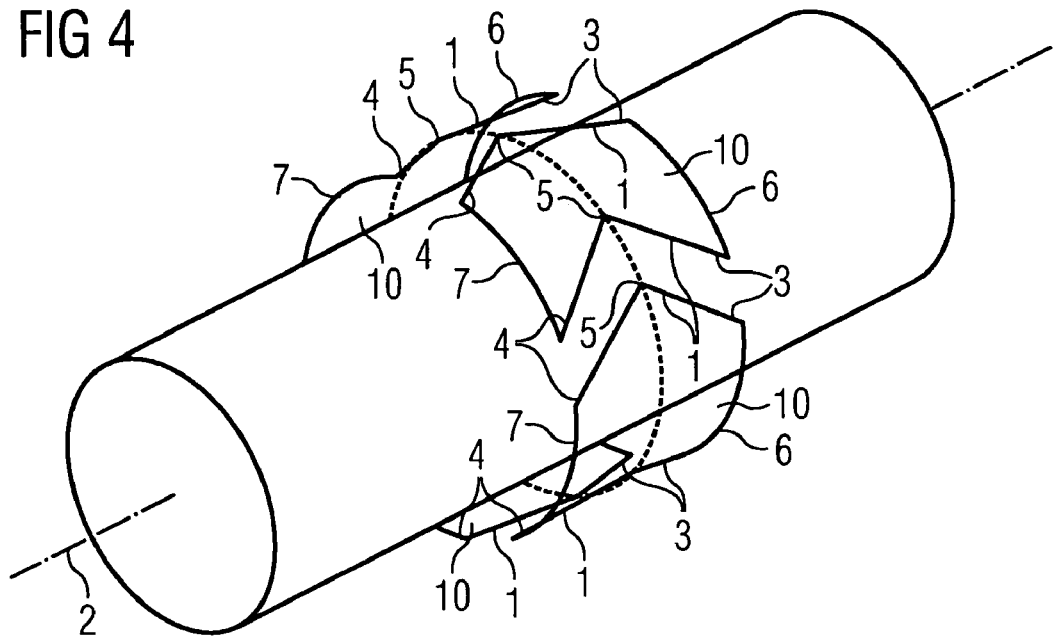

As in the antenna arrays according to FIG. 1 and FIG. 2, in the antenna arrays according to FIG. 3 and FIG. 4 the antenna rods 1 are mirror-symmetrical relative to a plane of symmetry 8. The plane of symmetry 8 is thereby arranged like the plane of symmetry of FIGS. 1 and 2. It in particular comprises the rod centers 5 and is shown in FIGS. 3 and 5 as a tangentially circumferential line of dots.

In contrast to the antenna arrangements of FIG. 1 and FIG. 2, however, the antenna rods 1 in the antenna arrays of FIG. 3 and FIG. 4 do not run exactly parallel to the antenna axis 2 but rather only essentially axially relative to the antenna axis 2. As can be seen from FIG. 5 and FIG. 6, each point 9 of an antenna rod 1 defines with the antenna axis 2 a radial direction. The rod center 5 thereby defines with the antenna axis 2, a reference direction. Each radial direction forms with the reference direction a tangential angle $\alpha$. This is shown in FIG. 5 and FIG. 6 for one such point 9. With regard to each antenna rod 1, the tangential angle $\alpha$ is clearly a non-constant function of the axial separation z of the respective point 9 from the rod center 5.

Figure 5:
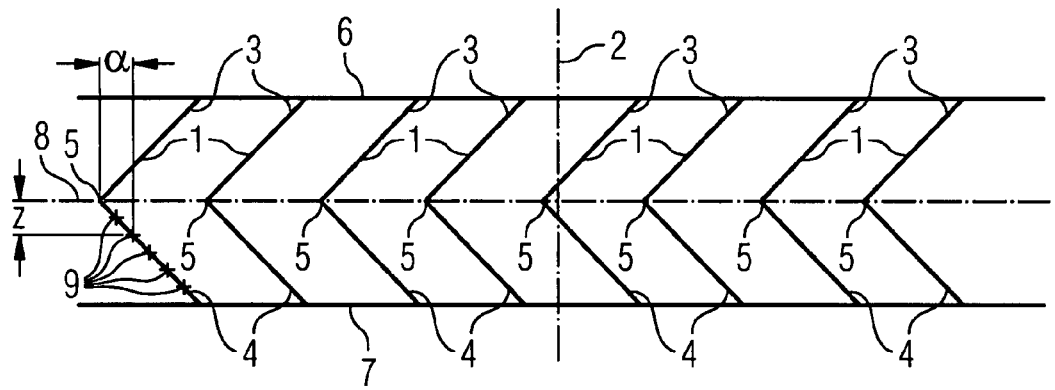
FIG. 5 and FIG. 6 respectively show the antenna arrangements of FIG. 3 and FIG. 4 in unrolled form.
Figure 6:
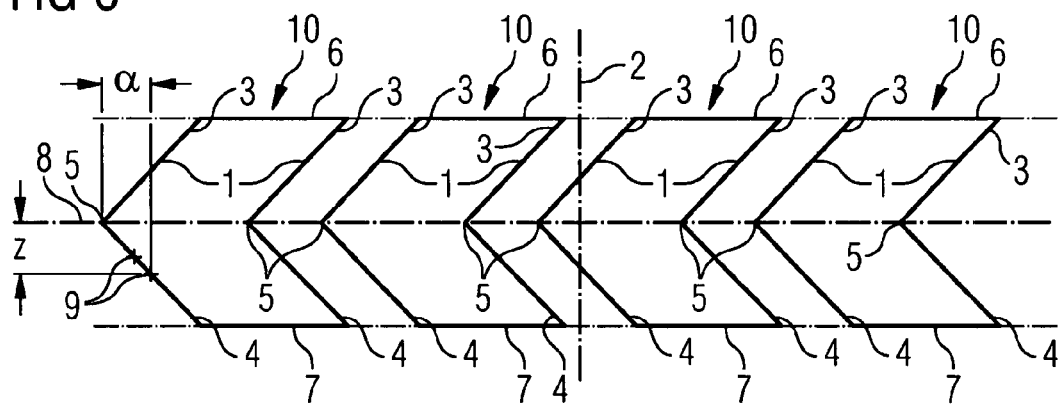

The antenna arrangement of FIG. 3 and FIG. 5 can be most simply understood such that one assumes that the rod centers 5 of the birdcage resonator from FIG. 1 have been connected with one another via a fictitious element (for example the plane of symmetry 8 plotted as dots in FIG. 3) and that the fictitious element has then been rotated around the antenna axis 2 while the connection elements 6, 7 have been held stationary. The creation of the antenna arrangement of FIG. 4 and FIG. 6 can be similarly imagined.

In the antenna arrangements of FIG. 3 through FIG. 6 the tangential angles $\alpha$ increase monotonically from the rod center 5 of each antenna rod 1 toward the rod ends 3, 4 of this rod end 1 with increasing axial spacing z of the points 9 from the rod center 5. The rise is thereby obviously linear with the axial separation z of the points 9 from the rod center 5. As is apparent from FIG. 7 and FIG. 9 for a single antenna rod 1, however, it is also possible that the tangential angles $\alpha$ increase more sharply or more weakly than linearly from the rod center 5 of each antenna rod 1 toward the rod ends 3, 4 of this antenna rod 1 with the axial separation z of the points 9 from the rod center 5. Which embodiment preferred is dependent on the individual case. The linear curve of the antenna rod 1 is plotted dashed as well in FIG. 7 and FIG. 8 for comparison.

In certain cases it can even be reasonable (see FIG. 9) for the tangential angles $\alpha$ to be monotonic only in segments from the rod center 5 of each antenna rod 1 towards the rod ends 3, 4 of this antenna rod 1. In this case the tangential angles $\alpha$ initially increase monotonically (advantageously linearly) in a first segment 11 from the rod center 5 of each antenna rod 1 toward the rod ends 3, 4 of this antenna rod 1 with the axial separation z of the points 9 from the rod center 5. In contrast to this, in at least one second segment 12 the tangential angles $\alpha$ decrease again monotonically with the axial separation z of the points 9 from the rod center 5. The first segment 11 is arranged closer to the rod center 5 than the second segment 12.

Figure 7:
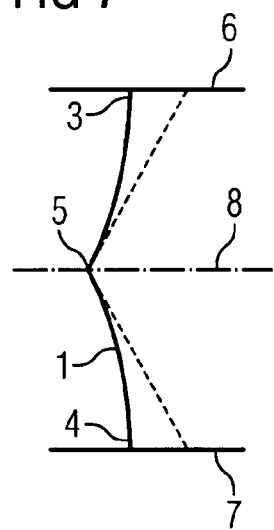
FIG. 7 and FIG. 8 respectively show modifications of the antenna arrangements of FIG. 5 and FIG. 6.
Figure 8:
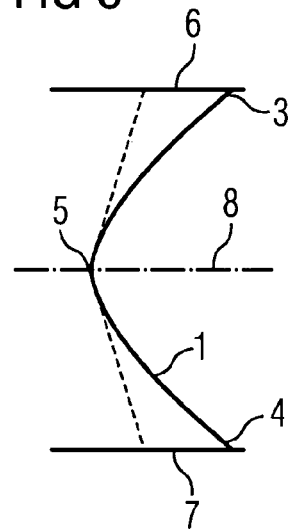
Figure 9:
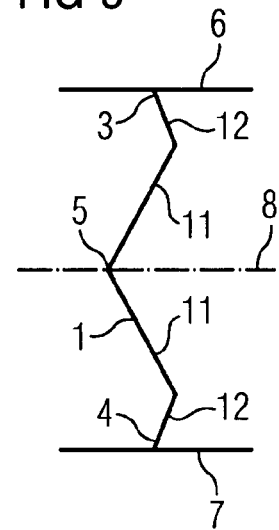
FIG. 9 shows a further modification of the antenna arrangements of FIG. 5 and FIG. 6.

The embodiments according to FIG. 7 through FIG. 9 are shown in the preceding only in connection with the birdcage-like antenna arrangement. However, they are naturally also possible in an antenna array as it shown in FIG. 4 and FIG. 6.

Using the inventive antenna arrangements it is possible to achieve higher excitation strengths in the transmission mode and to improve the signal-to-noise ratio in the acquisition mode given identical dimensions and the like. It is also possible to improve the homogeneity of the excitation profile. Moreover, it is possible to generate lower sensitivity in targeted regions in the axial boundary region of the examination volume, so aliasing artifacts in the reconstruction can be reduced.

Although modifications and changes may be suggested by those skilled in the art, it is the invention of the inventor to embody within the patent warranted heron all changes and modifications as reasonably and properly come within the scope of his contribution to the art.

I claim as my invention:

1. An antenna arrangement for a magnetic resonance system, comprising:
   a plurality of antenna rods arranged substantially regularly around an antenna axis, said antenna rods proceeding substantially axially relative to said antenna axis;
   each antenna rod having two opposite rod ends and a rod center between the two opposite rod ends;
   connection elements proceeding substantially tangential to said antenna axis that electrically-conductively connect the rod ends of each antenna rod with rod ends of at least one of said antenna rods immediately adjacent thereto;
   said antenna rods being nearer-symmetrical relative to a plane of symmetry proceeding perpendicular to said antenna axis;
   each point of each antenna rod defining, with said antenna axis, a radial direction, and said rod center defining, with said antenna axis, a reference direction, and each radial direction forming, with said reference direction, a tangential angle; and
   for each antenna rod, said tangential angle being a non-constant function of an axial spacing of the respective point from said rod center.

2. An antenna arrangement as claimed in claim 1 wherein said tangential angle increases monotonically from said rod center of each antenna rod, toward the respective two opposite rod ends of that antenna rod, with increasing axial spacing of the respective points of that antenna rod from the rod center.

3. An antenna arrangement as claimed in claim 2 wherein said tangential angle increases linearly from said rod center of each antenna rod toward the respective two opposite rod ends of that antenna rod, with increasing axial spacing of the respective points of that antenna rod from said rod center.

4. An antenna arrangement as claimed in claim 2 wherein said tangential angle increases more sharply than linearly from said rod center of that antenna rod toward the two opposite rod ends of that antenna rod, with increasing axial separation of the respective points of that antenna rod from said rod center.

5. An antenna arrangement as claimed in claim 2 wherein said tangential angle increases more weakly than linearly from said rod center of that antenna rod toward the two opposite rod ends of that antenna rod, with increasing axial separation of the respective points of that antenna rod from said rod center.

6. An antenna arrangement as claimed in claim 1 wherein:
   said tangential angle increases monotonically from said rod center in at least one first segment of each antenna rod toward the respective two opposite rod ends of that antenna rod, with increasing axial spacing of the respective points of that antenna rod from the rod center;
   said tangential angle decreases monotonically from said rod enter in at least one second segment of each antenna rod toward the respective two opposite rod ends of that antenna rod with increasing axial spacing of the respective points from the rod center; and
   said first segment being disposed closer to said rod center than said second segment.

7. An antenna arrangement as claimed in claim 1 wherein said connection elements are formed as closed ferrules, and wherein each antenna rod is electrically-conductively connected with one of said ferrules at each of the two opposite rod ends of that antenna rod.

8. An antenna arrangement as claimed in claim 1 wherein said connection elements are formed as ferrule segments, and wherein exactly two rod ends, from among said plurality of antenna rods, are electrically-conductively connected by each ferrule segment.

* * * * *